United States Patent [19]

Wegener et al.

[11] Patent Number: 4,730,123

[45] Date of Patent: Mar. 8, 1988

[54] CIRCUIT FOR DRIVING A CAPACITIVE LOAD WHICH PROVIDES LOW CURRENT CONSUMPTION

[75] Inventors: Fritz A. Wegener; Manfred Albach, both of Aachen, Fed. Rep. of Germany

[73] Assignee: U.S. Philips Corporation, New York, N.Y.

[21] Appl. No.: 924,549

[22] Filed: Oct. 29, 1986

[30] Foreign Application Priority Data

Oct. 30, 1985 [DE] Fed. Rep. of Germany ....... 3538552

[51] Int. Cl.4 .................. H03K 17/08; H03K 17/687; H03K 17/284; H03K 17/16
[52] U.S. Cl. ................... 307/200 B; 307/270; 307/246; 307/570; 361/91; 361/56
[58] Field of Search ............... 307/270, 570, 571, 577, 307/579, 585, 200 B, 451, 304, 456, 246; 357/43; 361/1, 56, 91, 111

[56] References Cited

U.S. PATENT DOCUMENTS

| | | | |
|---|---|---|---|
| 3,518,454 | 6/1970 | French | 307/571 |
| 4,293,782 | 10/1981 | Tanaka et al. | 307/304 |
| 4,471,245 | 9/1984 | Janutka | 307/270 |

*Primary Examiner*—Stanley D. Miller
*Assistant Examiner*—Tai V. Duong
*Attorney, Agent, or Firm*—David R. Treacy; Bernard Franzblau

[57] ABSTRACT

A circuit arrangement for driving a capcitive load comprises a control circuit (1), whose output is the collector of an output transistor (2). The collector is coupled through the gatesource path of a junction field effect transistor (5) and a resistor (6) connected parallel thereto to the capacitive load (8). The drain connection of the J-FET is connected to the supply voltage (Ub). The circuit permits rapid switching of the load while maintaining the current consumption relatively low.

6 Claims, 1 Drawing Figure

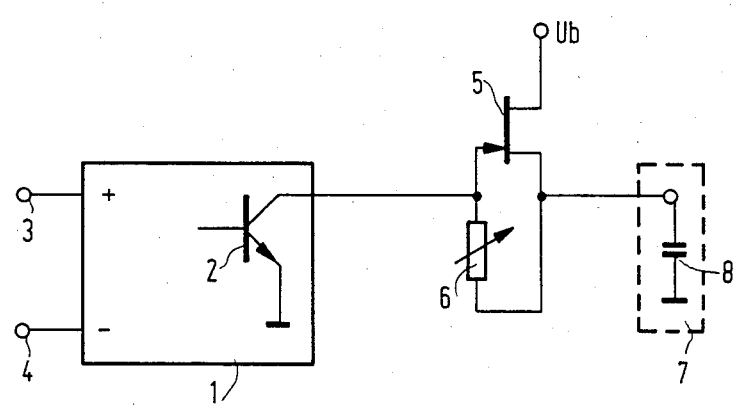

CIRCUIT FOR DRIVING A CAPACITIVE LOAD WHICH PROVIDES LOW CURRENT CONSUMPTION

This invention relates to a circuit arrangement comprising a control circuit whose output is the collector of an output transistor and which is coupled to a capacitive load to a supply voltage.

A control circuit, whose output is the collector of an output transistor, may be, for example, a comparator, which is connected to one or several inputs of a logic circuit, for example constructed in CMOS technology. At the junction point of the two circuits, a resistor is connected to a supply voltage. When the output transistor passes from the conductive state to the cut-off state, the voltage at the input of the CMOS circuit increases to a higher potential. It is known from the book by Tietze/Schenk with the title "Halbleiterschaltungstechnik", 5$^{th}$ edition, pages 161 and 162, that the voltage increase is determined by the parasitic capacitances of the CMOS circuit and the resistor connected to the supply voltage.

Since the known circuit arrangement may be used, for example, for the detection of maximum voltage levels in circuits for protection against excess voltages, it is required that the CMOS circuit react rapidly to errors detected by the protection circuit. Due to the predetermined capacitance of the CMOS circuit, a variation of the voltage increase can occur only through a reduction of the resistance. However, the current through the output transistor consequently increases when the latter is in the conductive state.

An object of the invention is to construct a circuit arrangement of the kind mentioned in the opening paragraph in such a manner that a rapid voltage increase with a low current consumption is attained.

According to the invention, this object is achieved in that the collector is coupled to the capacitive load through the gate-source path of a junction field effect transistor (J-FET) and a resistor connected parallel thereto and in that the drain connection is connected to the supply voltage.

On the understanding that the voltage increase should take place at exactly the same rate as in the known circuit arrangement, the current consumption in the circuit arrangement according to the invention is lower due to the junction field effect transistor. Upon the passage of the output transistor from the conductive state to the cut-off state, the junction field effect transistor behaves initially like a current source because the gate-source voltage is equal to zero and the field effect transistor is intrinsically conducting. Due to the charge of the capacitive load by the maximum drain-source shortcircuit current, the drain-source voltage becomes increasingly smaller and the field effect transistor passes to the cut-off state. When the output transistor passes from the cut-off state to the conductive state, first the source connection of the field effect transistor has approximately the potential of the supply voltage. As a result, the field effect transistor is cut off and the capacitive load is discharged through the resistor and the output transistor. The resistance value then determines the rate at which the capacitance is discharged. The discharge takes place approximately at the same rate as in the known circuit arrangement.

In a further embodiment of the invention, it is ensured that the resistor is adjustable.

In order that the invention may be readily carried out, it will now be described more fully, by way of example, with reference to the sole FIGURE of the accompanying drawing. A control circuit 1, which may comprise, for example, a comparator, has an output transistor 2, whose emitter is connected to ground and whose collector constitutes an output connection. The comparator 1 compares a signal at a terminal 3, which constitutes the non-inverting input of this comparator, with a signal at a terminal 4, which constitutes the inverting input and it sets the output transistor 2 in accordance with the comparison result either to the cut-off state or to the conductive state. In the cut-off state of the output transistor 2, the output voltage is larger than in the conductive state.

The collector of the transistor 2 is connected to a gate connection of an n-channel junction field effect transistor 5. The drain connection of this transistor 5 is connected to a supply voltage Ub. An adjustable resistor 6 is connected between the gate connection and the source connection of the field effect transistor 5. Furthermore, a logic circuit 7 constructed in CMOS-technology is connected to the source connection of the field effect transistor 5. This logic circuit represents a capacitive load which is indicated symbolically by a capacitance 8.

When the transistor 2 is switched from the conductive state to the cut-off state, the barrier layer 5 is first intrinsically conducting and the gate-source voltage is equal to zero. Since the field effect transistor 5 is conducting, the maximum shortcircuit current of the field effect transistor 5 flows from the supply voltage Ub into the capacitance 8. Due to the constant charge of the capacitance 8, the drain-source voltage of the transistor 5 decreases and the drain current becomes smaller so that the transistor passes from the conductive state to the cut-off state.

When the output transistor 2 is switched from the cut-off state to the conductive state, the source connection is first coupled approximately to the potential of the supply voltage Ub because the capacitance 8 was charged to this voltage, while the gate connection is approximately coupled to ground potential because the transistor 2 is conducting. Due to this high negative gate-source voltage, the field effect transistor 5 is cut off substantially completely and the capacitance 8 is discharged through the resistor 6 to a given gate-source voltage, at which a state of equilibrium is attained between the discharge and the charge by the supply voltage Ub. The gate-source voltage of the transistor 5 which is adjusted in the state of equilibrium lies below a maximum value of the input voltage of the CMOS circuit 7, at which a change of state of the CMOS circuit can take place.

Practical experiments have shown that the value of the resistor 6 should preferably lie between 1 and 6 k$\Omega$. At these resistance values, the discharge of the load capacitance takes place approximately at the same rate as the charge. By means of the adjustable resistor 6, the corresponding resistance value can be exactly adjusted. The current consumption in the circuit arrangement according to the invention is considerably lower than that in the known circuit arrangement on the understanding that the charge takes place in the same time period.

What is claimed is:

1. A circuit arrangement for operation of a capacitive load comprising: a control circuit including an output transistor having a collector connected to an output of the control circuit, a terminal for a source of supply voltage for the circuit arrangement, a junction field effect transistor having a drain, source and a gate, means coupling said output of the control circuit to said capacitive load via the gate-source path of said field effect transistor, a resistor connected in parallel with said gate-source path of the field effect transistor, means connecting the drain of the field effect transistor to said supply voltage terminal, and wherein the collector-emitter path of the output transistor is in parallel with the load so that the capacitive load will be discharged via said resistor and said output transistor when the output transistor is made to conduct.

2. A circuit arrangement as claimed in claim 1, characterized in that the resistor is adjustable.

3. A circuit arrangement as claimed in claim 1, wherein the output transistor is an NPN bipolar transistor with its emitter connected to a point of reference potential.

4. A circuit arrangement as claimed in claim 1, wherein the control circuit comprises a comparator having first and second inputs whereby the output transistor is switched between a cut-off state and a conductive state, and vice versa, in accordance with results of a comparison of signals applied to said first and second inputs of the comparator.

5. A circuit arrangement as claimed in claim 1, wherein the output transistor comprises a bipolar transistor having a base electrode supplied with a switching signal that switches said output transistor between conduction and cut-off, and vice versa.

6. A circuit arrangement as claimed in claim 1, wherein the output transistor is an NPN bipolar transistor with its emitter connected to a point of reference potential, and said capacitive load has one terminal connected to the source electrode of said field effect transistor and a second terminal connected to said point of reference potential.

* * * * *